US005798599A

United States Patent [19]

Harwood

[11] Patent Number: 5,798,599

[45] Date of Patent: Aug. 25, 1998

[54] ULTRASONIC TRANSDUCER ASSEMBLY USING CRUSH FOILS

[75] Inventor: Philip C. Harwood, Elgin, Ill.

[73] Assignee: Dukane Corporation, St. Charles, Ill.

[21] Appl. No.: 736,262

[22] Filed: Oct. 24, 1996

[51] Int. Cl.$^6$ .............................. H02W 2/00; H01L 41/08

[52] U.S. Cl. .............................................. 310/323; 310/325

[58] Field of Search ...................................... 310/323, 325, 310/328

[56] References Cited

U.S. PATENT DOCUMENTS

| | | | |
|---|---|---|---|
| 3,094,314 | 6/1963 | Kearney et al. | 310/325 |
| 3,101,419 | 8/1963 | Rich | 310/325 |
| 3,183,378 | 5/1965 | McCracken et al. | 310/328 |
| 3,187,207 | 6/1965 | Tomes | 310/328 |
| 3,218,488 | 11/1965 | Jacke | 310/325 |
| 3,328,610 | 6/1967 | Jacke et al. | 310/325 |
| 3,524,085 | 8/1970 | Shoh | 310/325 |
| 3,561,734 | 2/1971 | Antonevich | 310/328 |
| 3,703,037 | 11/1972 | Robinson | 32/58 |
| 3,772,538 | 11/1973 | Supitilov | 310/325 |
| 4,496,101 | 1/1985 | Northman | 310/323 |
| 4,530,138 | 7/1985 | Ritter | 310/325 |
| 4,718,421 | 1/1988 | Rohwedder et al. | 128/328 |
| 4,803,763 | 2/1989 | Eturo et al. | 29/25.35 |
| 4,890,494 | 1/1990 | Osbond et al. | 73/338 |
| 5,113,566 | 5/1992 | Weekamp et al. | 29/25.35 |
| 5,115,161 | 5/1992 | Myohga et al. | 310/323 |
| 5,163,209 | 11/1992 | Harada et al. | 29/25.35 |
| 5,191,687 | 3/1993 | Dam et al. | 29/25.35 |
| 5,196,756 | 3/1993 | Kohno et al. | 310/328 |
| 5,271,133 | 12/1993 | Dam et al. | 29/25.35 |
| 5,295,288 | 3/1994 | Dam et al. | 29/25.35 |
| 5,376,858 | 12/1994 | Imabayashi et al. | 310/333 |
| 5,469,011 | 11/1995 | Safabakhsh | 310/325 |

*Primary Examiner*—Thomas M. Dougherty
*Attorney, Agent, or Firm*—Emrich & Dithmar

[57] ABSTRACT

A pre-stressed, sandwich-type, ultrasonic transducer assembly includes front and rear mass members having stacked therebetween alternating piezoelectric members and electrode members, with each of the members having surfaces which are substantially flat except for minute surface irregularities. Thin, soft, aluminum foil washers are respectively disposed between the facing surfaces of adjacent members of the stack. At least one bolt joins the front and rear mass members to subject it to a compressive pre-load, under which load the washers deform to follow the surface irregularities of the adjacent member surfaces and thereby fill inter-element voids created by such irregularities.

16 Claims, 2 Drawing Sheets

ULTRASONIC TRANSDUCER ASSEMBLY USING CRUSH FOILS

BACKGROUND OF THE INVENTION

1. Field of the Invention

The present invention relates to ultrasonic transducer assemblies and, in particular, to transducer assemblies of the composite or sandwich type with a center bolt for compressively loading the assembly. The term "ultrasonic" is used herein to refer to frequencies in the kHz range, typically from about 10 kHz to about 100 kHz.

2. Description of the Prior Art

High-intensity ultrasonic transducers of the composite or sandwich type typically include front and rear mass members with alternating annular piezoelectric transducers and electrodes stacked therebetween. Most such high-intensity transducers are of the pre-stressed type. They employ a compression bolt that extends axially through the stack to place a static bias of about one-half of the compressive force that the piezoelectric transducers can tolerate. When the transducers operate they are designed to always remain in compression, swinging from a minimum compression of nominally zero to a maximum peak of no greater than the maximum compression strength of the material. The bolt may be threadedly engaged with the front mass member or with a nut.

Such high-intensity transducers require intimate surface contact between adjacent members of the stack to assure maximum acoustic transparency and to minimize the existence of voids which might produce reflected energy out of phase with the initial traveling wave. Typically, this intimacy of contact requires that the flat abutting surfaces of the members be finished within 2 Newtonian rings per inch of flatness, as measured with optical light band readings, and with a surface finish better than 8 microinches roughness height, as measured by commercial roughness comparator specimens. This normally requires the application of a lapping process to the machined parts to substantially eliminate minute surface irregularities in the as-machined parts, which are typically as great as 32 microinches roughness height. This lapping adds substantially to the manufacturing costs of the transducer assemblies.

SUMMARY OF THE INVENTION

It is a general object of the invention to provide an improved ultrasonic transducer assembly of the pre-stressed sandwich type, which avoids the disadvantages of prior transducer assemblies while affording additional structural and operating advantages.

An important feature of the invention is the provision of a transducer assembly of the type set forth which affords improved performance.

A still further feature of the invention is the provision of a transducer assembly of the type set forth which does not require expensive surface finishing of the parts of the assembly.

Still another feature of the invention is the provision of a transducer assembly of the type set forth, which is of relatively simple and economical construction.

Certain ones of these and other features of the invention are attained by providing a pre-stressed sandwich-type ultrasonic transducer assembly including a stack of active and passive elements, each having front and rear surfaces which are substantially flat except for minute surface irregularities, with the stack subjected to a compressive pre-load. A plurality of thin foil members are respectively disposed between facing surfaces of adjacent elements of the stack, each of the foil members being sufficiently soft to deform to follow the surface irregularities of the adjacent element surfaces under the compressive pre-load of the stack and thereby fill inter-element voids created by such irregularities.

The invention consists of certain novel features and a combination of parts hereinafter fully described, illustrated in the accompanying drawings, and particularly pointed out in the appended claims, it being understood that various changes in the details may be made without departing from the spirit, or sacrificing any of the advantages of the present invention.

BRIEF DESCRIPTION OF THE DRAWINGS

For the purpose of facilitating an understanding of the invention, there is illustrated in the accompanying drawings a preferred embodiment thereof, from an inspection of which, when considered in connection with the following description, the invention, its construction and operation, and many of its advantages should be readily understood and appreciated.

DESCRIPTION OF THE PREFERRED EMBODIMENT

Figure 1:
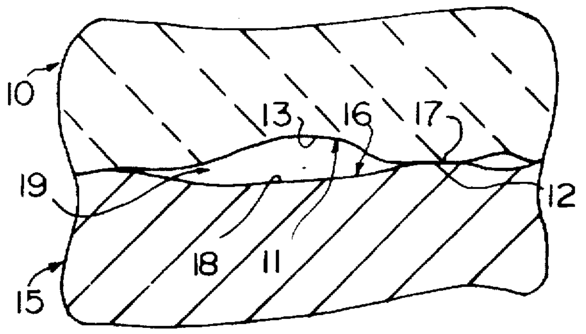
FIG. 1 (PRIOR ART)
FIG. 1 is a fragmentary sectional view of a portion of a prior art transducer assembly.

Referring to FIG. 1, there is illustrated a highly magnified cross section of a portion of the interface between two adjacent members of a prior art sandwich-type transducer assembly. In particular, there is shown the interface between a ceramic piezoelectric transducer 10 and a metal electrode 15. The transducer 10 has a surface 11 which, as machined, is relatively flat but, nevertheless, includes minute irregularities including peaks 12 and valleys 13. Similarly, the electrode 15 has a surface 16 which faces the surface 11 and which, as machined, is substantially flat but includes a number of surface irregularities including peaks 17 and valleys 18. It can be seen that when the transducer assembly is placed under a compressive pre-load the surfaces 11 and 16 are firmly pressed into engagement with each other but, because of the surface irregularities, there result a number of voids 19 so that the actual area of surface contact between the parts is substantially less than the area of the surfaces 11 and 16. These voids 19 can significantly interfere with the efficiency and performance of the transducer assembly.

Figure 2:
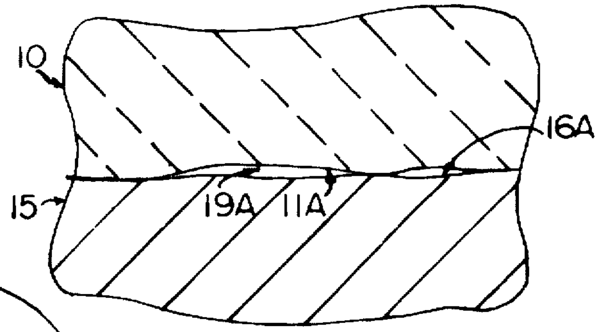
FIG. 2 (PRIOR ART)
FIG. 2 is a view similar to FIG. 1 of a portion of another prior art transducer assembly.

As was explained above, in order to minimize this deleterious effect of imperfect surface flatness, it is known in the prior art to treat the as-machined surfaces with optical lapping techniques or the like, to result in highly polished surfaces 11A and 16A, illustrated in FIG. 2. This treatment significantly reduces the deviation from perfect flatness of the surfaces so that, when they are pressed together under the compressive pre-load, the area of surface contact is greatly increased and the volume of the voids 19A is significantly reduced, but at the considerable expense of the surface finishing techniques.

Figure 3:
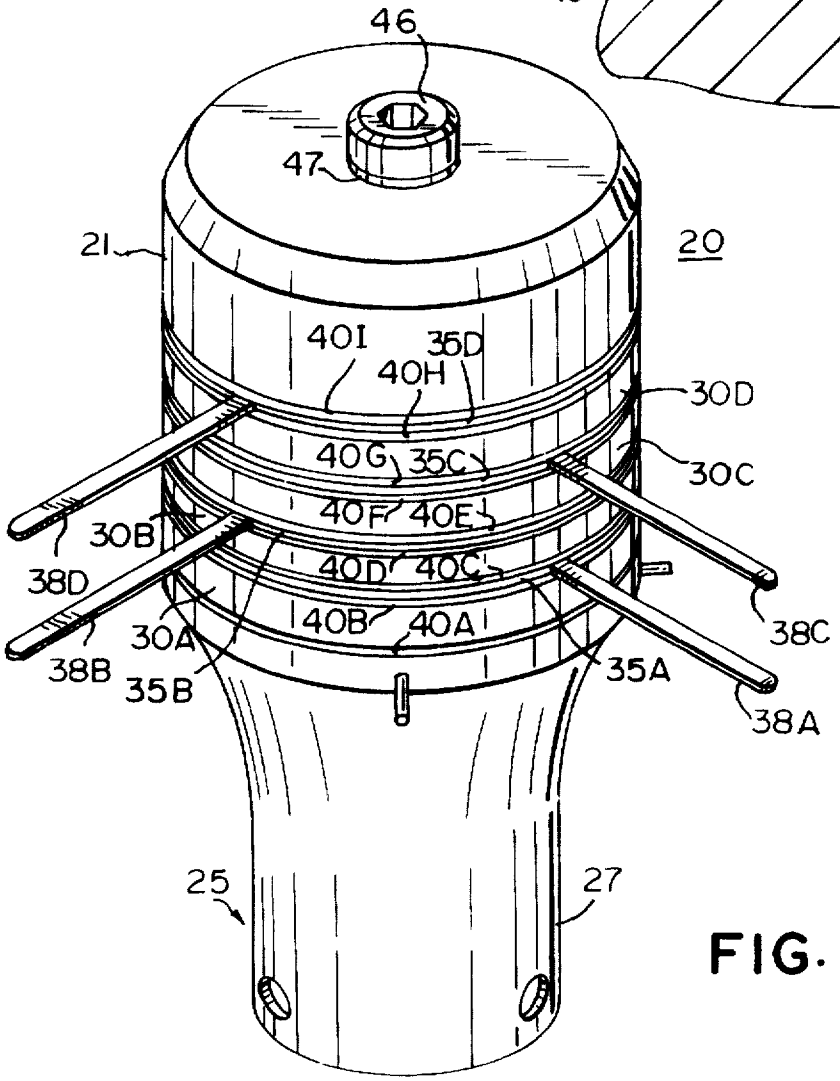
FIG. 3 is a perspective view of a transducer assembly constructed in accordance with and embodying the features of the present invention.
Figure 4:
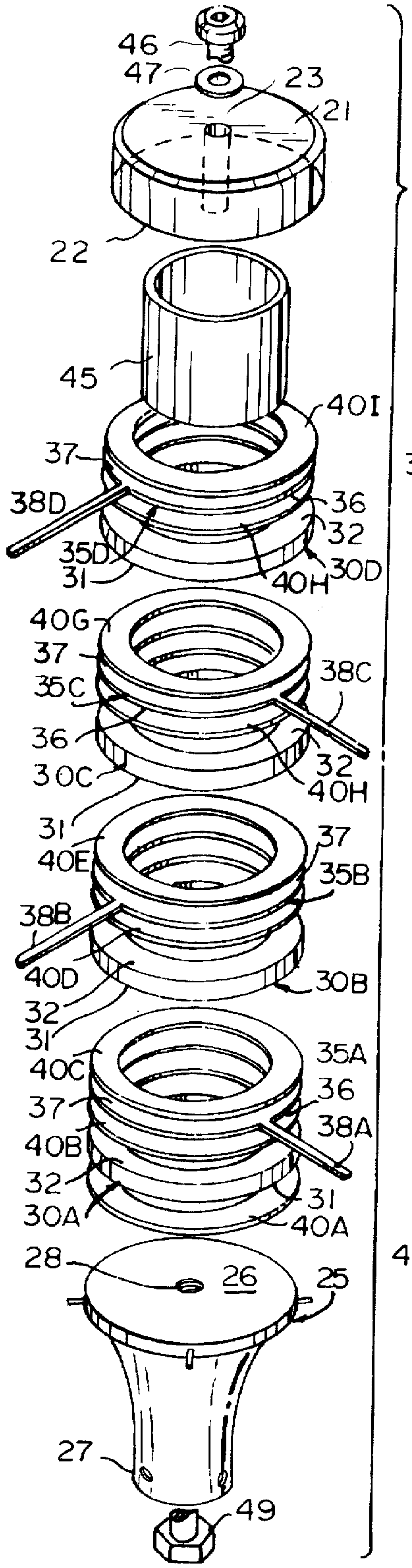
FIG. 4 is a reduced, exploded, perspective view of the transducer assembly of FIG. 3.

Referring now to FIGS. 3 and 4, there is illustrated a sandwich-type, pre-stressed transducer assembly, generally designated by the numeral 20, in accordance with the present invention. The transducer assembly 20 includes a rear mass or slug 21, which may be formed of a suitable metal, having a substantially circular front surface 22 and with an axial bore 23 formed therethrough. The assembly is also provided with a front mass or slug 25 of suitable metal having a substantially circular rear surface 26 of diameter at least as great as that of the front surface 22 of the rear mass or slug 21. The front mass 25, as illustrated, is tapered to a reduced-diameter front end 27 and has an axial, internally threaded bore 28 extending therethrough. It will be appreciated that the front mass 25 could have various shapes depending upon the particular application.

Figure 5:
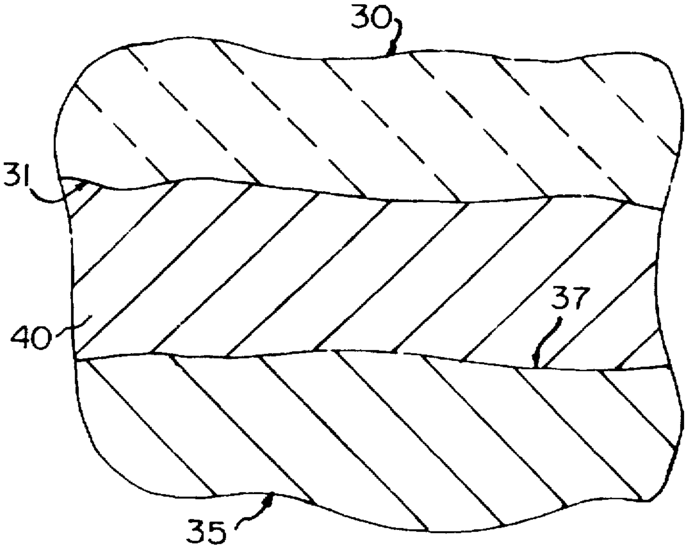
FIG. 5 is a view similar to FIG. 2 of the transducer assembly portion shown therein incorporating a crush washer in accordance with the present invention.
Figure 6:
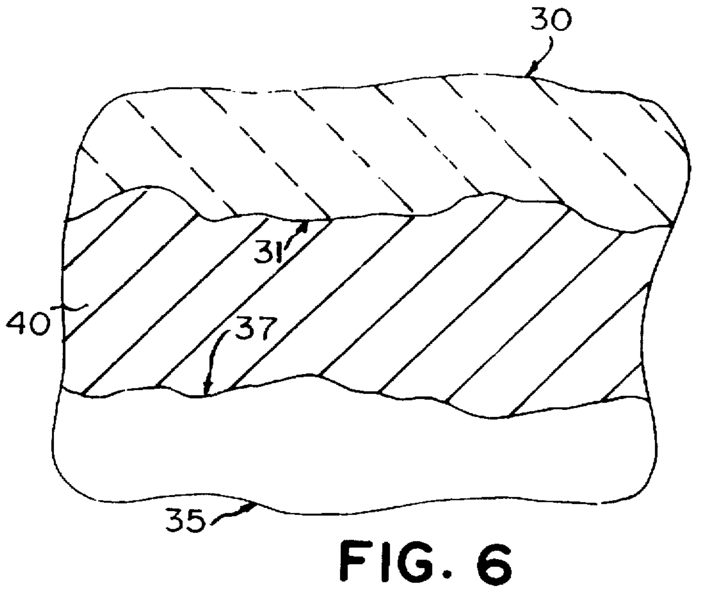
FIG. 6 is view similar to FIG. 1 of the transducer assembly portion shown therein incorporating a crush washer in accordance with the present invention.

Stacked between the front and rear masses 21 and 25 are a plurality of alternating annular piezoelectric ceramic elements, generally designated 30, and annular metal electrodes, generally designated 35 (see FIGS. 5 and 6). In the illustrated embodiment, there are four of the piezoelectric elements, respectively designated 30A–30D, and four of the electrodes, respectively designated 35A–35D. All of the piezoelectric elements 30 and electrodes 35 have substantially the same inner diameter and substantially the same outer diameter, the latter being substantially the same as the outer diameter of the front surface 22 of the rear mass 21. Each of the piezoelectric elements 30A–30D has a substantially flat front surface 31 and a substantially flat rear surface 32, while each of the electrodes 35A–35D has a substantially flat front surface 36 and a substantially flat rear surface 37. The electrodes 35A–35D are also respectively provided with radially outwardly extending tabs or tails 38A–38D, to facilitate connection to associated circuitry, in a known manner.

In a typical 20-kHz transducer assembly, each of the piezoelectric elements 30 is approximately 0.20 inch in thickness, while each of the electrodes 35 has a thickness of approximately 0.005 inch. However, it will be appreciated that the relative sizes of these parts can vary, depending upon the operating frequency of the transducer assembly and the particular application for which it is intended. The electrodes 35 are typically formed of a suitably strong, electrically conductive material, such as stainless steel, which can tolerate the substantial vibrational stress and flexure experienced in use.

It is a fundamental aspect of the present invention that the transducer assembly 20 also includes a plurality of annular foil washers, referred to hereinafter as "crush washers," which alternate with the piezoelectric elements 30 and electrodes 35, so that a crush washer 40 is disposed at each interface between a piezoelectric element 30 and an electrode 35, as well as at the interface between the rear mass 21 and the adjacent electrode 35D and at the interface between the front mass 25 and the adjacent piezoelectric element 30A, as illustrated in FIGS. 3 and 4. Preferably, each of the crush washers 40 has inner and outer diameters substantially the same as those of the electrodes 35 and, in the illustrated embodiment, there are nine crush washers, respectively designated 40A–40I. The crush washers 40A–40I are identical in construction, preferably being formed of an electrically conductive metal which is sufficiently soft that it will deform to follow the surface irregularities in the adjoining surfaces of the piezoelectric elements 30 and electrodes 35 when subjected to the compressive pre-load of the transducer assembly 20, as will be explained more fully below. However, the material of the crush washers 40 must not be so soft as to continue to flow and eventually relax the compression of the transducer assembly 20, nor must it be so hard that no coining or deformation occurs under the available compressive force. The work hardening characteristics of the material must allow continued deformation until the compression per square unit is too low to support continued deformation. A number of metals have been identified meeting these criteria, including aluminum annealed to dead soft (grades EC-0, 1100-0, and 3003-0), lead, tin, zinc and gold. In the preferred embodiment, the crush washers 40 are formed of dead soft aluminum, because of considerations such as cost, material characteristics and availability. In the preferred embodiment, each of the crush washers 40A–40I has a thickness which is governed primarily by ease of handling, typically in the range of from about 0.001 inch to about 0.010 inch. A convenient thickness has been found to be approximately 0.005 inch.

The transducer assembly 20 may also include a cylindrical spacer 45, which may be formed of any of a variety of electrically insulating materials, one such material being PTFE of the type sold by E. I. DuPont de Nemours & Co. under the trademark TEFLON. The spacer has an outer diameter very slightly less than the inner diameter of the annular members 30, 35 and 40 and serves to coaxially align the parts during assembly and provide electrical insulation, as described below. In assembly, the crush washers 40A–40I, the piezoelectric elements 30A–30D and the electrodes 35A–35D are stacked in alternating fashion on the rear surface 26 of the front mass 25 in a congruent stack in the order illustrated in FIG. 4., so that there is a crush washer 40 between adjacent ones of all of the other members, so that every other element in the stack is a crush washer 40. Thus, going from front to back, the stack includes the front mass 25, a crush washer 40A, the piezoelectric element 30A, the crush washer 40B, the electrode 35A, the crush washer 40C, the piezoelectric element 30B, and so forth, with the last crush washer 40I being disposed between the last electrode 35D and the rear mass 21.

As will be understood by those skilled in the art, the piezoelectric elements 30 and the electrodes 35 are arranged so that the piezoelectric elements 30 are electrically in parallel and mechanically in series. Thus, alternate ones of the electrodes 35 have their tabs 38 connected together and to one terminal of an associated ultrasonic generator. The remaining alternate tabs are connected together and to the other terminal of the generator. The electrodes 35 electrically connected to the front and rear masses 25 and 21 are connected to the return terminal of the ultrasonic generator, while the remaining electrodes are connected to the high voltage terminal of the ultrasonic generator. The spacer 45 fits axially down through the center of the stack and preferably has an axial length greater than the accumulated axial height of the stacked members 30, 35 and 40 and fits into recesses (not shown) machined in the surfaces 22 and 26 of the rear and front masses 21 and 25. The recesses are deep enough to allow for deformation of the crush washers 40, as will be explained below. A bolt 46 fits axially downwardly through the bore 23 of the rear mass 21 and through the spacer 45 and is threadedly engaged in the rear end of the threaded bore 28 of the front mass 25, a washer 47 preferably being provided between the head of the bolt 46 and the rear face of the rear mass 21. It will be appreciated that the spacer 45 not only serves to align the parts, but also provides electrical insulation against high-voltage arc over to the bolt 46. While an axial bolt is illustrated, it will be appreciated that plural bolts around the periphery of the masses 21 and 25 could be used, and an adequate air gap could provide the requisite insulation in lieu of the spacer 45.

Initially, the surfaces of the piezoelectric elements 30 and the electrodes 35 engage the intervening crush washers 40 only at the peaks of the surface irregularities, in much the same manner as is illustrated in the prior art assemblies of FIGS. 1 and 2. However, in use, the bolt 46 is tightened sufficiently to exert a predetermined compressive bias or pre-load on the assembly 20. In the 20-kHz transducer assembly illustrated in FIGS. 3 and 4, the predetermined compressive pre-load is approximately 3300 psi (250 kg./square cm.), which is equal to one-half the ultimate compressive strength of the ceramic material of the piezoelectric elements 30. This is so that, in operation, the piezoelectric elements 30 will always remain in compression, swinging from a minimum compression of nominally zero to a maximum peak of no greater than the maximum compressive strength of the material.

Referring now to FIGS. 5 and 6, it is a fundamental aspect of the invention that, since the adjacent surfaces of the members of the transducer assembly stack are initially in contact only at the peaks of the surface irregularities, the unit pressure under the compressive pre-load is initially very high, since the actual surface area in contact is limited to a very small percentage of the available surface area. The extremely high pressure causes the material of the crush washers 40 to deform, coining the surfaces thereof to intimate conformation with the surfaces of the adjacent members. As the surfaces conform, the contact area increases, reducing the force per unit area. Eventually, the force/coinability reaches an equilibrium, and material flow ceases. FIG. 5 illustrates the interface between a piezoelectric element 30, an electrode 35 and the intervening crush washer 40 under the compressive pre-load, wherein the piezoelectric element 30 and electrode 35 are of the highly polished type typically required in prior art commercial transducer assemblies. It can be seen that the crush washer 40 is deformed to substantially fill all of the voids between the piezoelectric element 30 and the electrode 35.

While these highly polished members have been found to provide satisfactory performance in prior art transducer assemblies, it has been found that by the use of the crush washers 40 of the present invention, significant improvement in the performance of the transducer assembly is realized. A number of samples of the transducer assembly 20 of the present invention were tested and compared with a like number of samples of the prior art transducer assembly without the crush foils 40, utilizing a Hewlett Packard 4194A impedance analyzer. It was found that the use of crush washers resulted in significant improvement in a number of operating parameters.

The encouraging results of the tests on these 20-kHz transducer assemblies led to further tests of 40-kHz transducer assemblies, since the latter are more critical of surface irregularities and would more effectively demonstrate advantages of the crush washers of the present invention. The 40-kHz transducer assembly evaluated has two piezoelectric elements 30 and requires five crush washers 40. Ten prior art production transducer assemblies were compared with 10 transducer assemblies including the crush washers 40 of the present invention. Table I sets forth the results, listing for each of a number of ultrasonic transducer operating parameters the average values for the tested samples of the prior art assemblies ("no crush washers") and of the present invention ("crush washers"), and also listing the percent improvement in the operating parameter realized with the transducer assembly of the present invention utilizing crush washers. Each of the several listed operating parameters will be understood by those skilled in the ultrasonic transducer art.

TABLE I

| Parameter | No Crush Washers | Crush Washers | % Improvement |
|---|---|---|---|
| $F_r$ (ohms) | 5.498 | 4.182 | 23.93 |
| $L/F_r$ (mH) | 3.326E–02 | 3.056E–02 | 8.11 |
| $C_a/F_r$ (pF) | 5.089E–10 | 5.678E–10 | 11.58 |
| $C_b/F_r$ (pF) | 4.156E–09 | 4.308E–09 | 3.66 |
| Q | 1484 | 1767 | 19.07 |
| $\Delta F(F_r–F_a)$ (Hz) | 2306 | 2441 | 5.85 |
| $RF_a$ (ohms) | 2.021E+05 | 2.495E+05 | 23.45 |
| $C_a + C_b$ | 4.664E–09 | 4.860E–09 | 4.19 |
| C @ 1 kHz (pF) | 4.520E–09 | 4.756E–09 | 5.22 |
| Watts | 5.00 | 3.39 | 32.20 |

As can be seen from Table I, every one of the listed operational parameters showed an improvement as a result of use of the crush washers 40 of the present invention. Most significantly, the power consumption ("Watts") showed a 32.2% improvement with the use of the present invention. Furthermore, all reactive parameters displayed more tightly grouped values from test sample to test sample, i.e., the overall range from the maximum value to the minimum value for a given parameter among the test samples was significantly lower in the case of the present invention.

Referring to FIG. 6, it has been found that, even more significantly, these improved results with the present invention can be realized even if the transducer assembly is formed using parts in their as-machined condition (see FIG. 1) rather than in their optically lapped, highly polished condition. FIG. 6 shows that, under the compressive pre-load, even with these as-machined parts the crush washers 40 deform to conform to the larger surface irregularities, resulting in a transducer assembly which exhibits performance characteristics which are not significantly worse than those illustrated in Table I. Thus, with the use of the present invention, it is possible to completely eliminate the expensive optical lapping and polishing operations, resulting in a transducer assembly which has not only significantly improved performance but also significantly reduced cost.

While the transducer assembly 20 illustrated in FIGS. 3 and 4 utilizes four each of the piezoelectric elements 30 and electrodes 35, it will be appreciated that other numbers of these elements may be used, depending upon the particular operational frequency and particular application, and the number of parts shown in FIGS. 3 and 4 is used simply for purposes of illustration. Furthermore, while in the illustrated embodiment the bolt 46 is threadedly engaged with the front mass 25, it will be appreciated that, alternatively, it could extend through an un-threaded bore in the front mass 25 and be threadedly engaged with a nut 49 or other fastener at the front end of the assembly.

From the foregoing, it can be seen that there has been provided an improved pre-stressed, sandwich-type, ultrasonic transducer assembly which is of economical construction and has significantly improved performance, and can obviate the expensive surface finishing techniques required in prior art transducer assemblies.

While particular embodiments of the present invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

I claim:

1. In a pre-stressed sandwich-type ultrasonic transducer assembly having opposite end surfaces and including a stack of active elements and passive electrode elements each having front and rear surfaces which are substantially flat except for minute surface irregularities, with the stack subjected in operation to, a compressive pre-load, the improvement comprising:

a plurality of thin electrically conductive foil members respectively disposed between facing surfaces of adjacent elements of the stack and spaced from the end surfaces, each of said foil members being sufficiently soft to deform to follow the surface irregularities of the adjacent element surfaces under the compressive pre-load of the stack and fill inter-element voids created by such irregularities, thereby to enhance acoustic performance of the transducer assembly.

2. The ultrasonic transducer assembly of claim 1, wherein each of said active elements is a ceramic piezoelectric element.

3. The ultrasonic transducer assembly of claim 2, wherein the number of said piezoelectric elements is greater than two.

4. The ultrasonic transducer assembly of claim 1, wherein said passive elements include a front mass member and a rear mass member and at least one electrode between said members.

5. The ultrasonic transducer assembly of claim 1, and further comprising compression means for applying the compressive pre-load, the stack being held together solely by said compression means.

6. The ultrasonic transducer assembly of claim 1, wherein each of said foil members is formed of a relatively soft metal.

7. The ultrasonic transducer assembly of claim 6, wherein each of said foil members is formed of soft aluminum.

8. In a pre-stressed sandwich-type ultrasonic transducer assembly including a front mass member having a front end surface and a rear surface, a rear mass member having a rear end surface and a front surface, a plurality of alternating annular electrode members and piezoelectric members each having front and rear surfaces with the electrodes and piezoelectric members disposed between the front and rear mass members to form therewith a stack having a front-to-rear axis, and axial threaded fastener means placing the stack in operation under a predetermined compressive load, the improvement comprising:

a plurality of thin annular electrically conductive foil washers respectively disposed between facing surfaces of adjacent members of the stack and spaced from the end surfaces, each of said foil washers being sufficiently soft to deform to follow the surface irregularities of the adjacent member surfaces under the compressive load of the stack and fill inter-member voids created by such irregularities, thereby to enhance acoustic performance of the transducer assembly.

9. The ultrasonic transducer assembly of claim 8, wherein said threaded fastener means includes at least one bolt.

10. The ultrasonic transducer assembly of claim 9, wherein said at least one bolt extends through said rear mass member and is threadedly engaged with said front mass member.

11. The ultrasonic transducer assembly of claim 8, and further comprising a spacer sleeve disposed between said mass members and extending axially through said annular members and washers.

12. The ultrasonic transducer assembly of claim 11, wherein said threaded fastener means includes a bolt extending axially through said sleeve.

13. The ultrasonic transducer assembly of claim 12, wherein said bolt extends axially through said rear mass member and is threadedly engaged with said front mass member.

14. The ultrasonic transducer assembly of claim 8, wherein each of said washers is substantially coextensive with adjacent surfaces.

15. The ultrasonic transducer assembly of claim 8, wherein each of said foil members is formed of a relatively soft metal.

16. The ultrasonic transducer assembly of claim 15, wherein each of said foil members is formed of soft aluminum.

* * * * *